(12) United States Patent
Wang

(10) Patent No.: US 6,448,599 B1
(45) Date of Patent: Sep. 10, 2002

(54) SEMICONDUCTOR DEVICE FOR PREVENTING PROCESS-INDUCED CHARGING DAMAGES

(75) Inventor: Mu-Chun Wang, Hsin-Chu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/725,070

(22) Filed: Nov. 29, 2000

(51) Int. Cl.[7] ................................................ H01L 29/94
(52) U.S. Cl. ....................................... 257/300; 257/296
(58) Field of Search ................................. 257/296–313, 257/723, 752

(56) References Cited

U.S. PATENT DOCUMENTS

| | | | | |
|---|---|---|---|---|
| 5,838,176 A | * | 11/1998 | Deibruck et al. | ............. 327/95 |
| 6,159,791 A | * | 12/2000 | Jeon | ............................ 438/253 |
| 6,175,130 B1 | * | 1/2001 | Hosotani et al. | ............ 257/301 |
| 6,191,441 B1 | * | 2/2001 | Aoki et al. | .................. 257/295 |

* cited by examiner

Primary Examiner—Fetsum Abraham
Assistant Examiner—Leonardo Andujar

(57) ABSTRACT

A semiconductor device for preventing process-induced charging damages is disclosed. The semiconductor device comprises a semiconductor layer, at least one transistor comprising a source region, a drain region, a channel region, a gate oxide layer and a gate electrode, at least one parasitic capacitor comprising a conductive layer, a dummy conductive layer constituting a dummy pattern, and a dielectric layer interposed between the conductive layer and the dummy conductive layer, a first conductor connecting the gate electrode and the conductive layer, and a second conductor connecting the semiconductor layer and the dummy conductive layer. Furthermore, the dummy conductive layer can be a floating layer over the semiconductor layer. In such manner, the second conductor set forth is replaced by an interposed dielectric layer.

24 Claims, 3 Drawing Sheets

SEMICONDUCTOR DEVICE FOR PREVENTING PROCESS-INDUCED CHARGING DAMAGES

BACKGROUND OF THE INVENTION

1. Field of the Invention

The present invention relates to semiconductor device technologies and engineering, and more particularly to the technologies of the protection of semiconductor devices from process-induced charging damages during semiconductor device processing.

2. Description of the Related Art

The antenna effect or the floating gate effect is the name given to the phenomena of induced voltages that can collect on partially processed leads. The effect is partially prevalent during plasma processes e.g., etching, deposition, ashing and ion implantation, and can lead to damage to thin gate oxide regions of the device under construction.

Process-induced charging and ensuing gate oxide damage constitutes a significant yield and reliability detriment for submicron CMOS technology. Problems occur at many stages of processing, but are aggravated by long lead lengths at lead definition following the material of the lead deposition, and the material of the lead can be, polysilicon, copper and aluminum, for example. As devices are further scaled to reduced geometries, the gate oxide becomes progressively thinner and hence more susceptible to damage, even at reduced voltages.

Charge accumulation on partially processed leads, and the resultant voltage increase, can cause voltage overstress and result in charge trapping in gate oxides and gate oxide breakdown. Previously, simple n+/p or p+/n junction diodes were used to protect oxides from the antenna effect during VLSI processing. As gate oxides have become thinner in reduced geometry devices, such as 0.5 micron and further reduced geometry devices, gate oxide damage tends to occur prior to protective junction diode breakdown. As a consequence, use of the diode for protection from the antenna effect discussed above becomes ineffective as the gate oxide thickness is scaled below thicknesses of about 100 angstroms, which have breakdown voltages on the order of about 16 volts or less. Accordingly, it would be desirable to provide an alternative type of protective device that is operable to protect gate oxides having thicknesses below about 100 angstroms, as can be expected to be required in the generation ULSI (i.e., less than 100 angstroms gate oxide thickness) and further reduced geometry devices.

FIG. 1A depicts a conventional protection device 10 used to solve the charge induced antenna effect, and FIG. 1B shows the circuit. It is to be appreciated that the illustrated device can be constructed in accordance with a variety of known processing techniques, the specific manner of processing not being relevant to the following discussion. The protection device 10 includes a substrate 12 that is typically formed from a semiconductive material such as silicon, which is doped with a p-type impurity. The semiconductor substrate 12 can also be formed from a variety of other semiconductive materials, such as GaAs and HgCdTe, for which the principles of the present invention that are set forth below are likewise applicable. In the illustrated structure, a metal oxide semiconductor field effect transistor (MOSFET) under construction is designated generally by reference character 14, and the associated protective component, is designated generally by reference character 16. The protective component that is presently utilized in the art is typically an n+/p or a p+n junction diode.

The protection device 10 includes shallow trench isolation (STI) regions 18a–18d, which can be developed in the substrate 12 in a conventional manner. Interposed between the STI regions 18a and 18b are source and drain regions 26a, 26b that is formed by using conventional methods, and a gate oxide region 22 that is typically thermally grown to a thickness of about 4–20 nm. A layer of polysilicon 24 is patterned and applied in an appropriate manner over the gate oxide 22 and doped with an appropriate impurity, such as phosphorus, to render the polysilicon layer 24 conductive. Dielectric layer 32 is applied over the polysilicon and underlying STI regions 18a–18d and is patterned and etched to create a channel such as a contact opening that extends from an upper surface of the dielectric layer 32 to an upper surface of the polysilicon layer 24 and a channel that extends from an upper surface of the dielectric layer 32 to a moat region 36. The contact opening can be filled with an appropriate metal conductor, such as an alloy of aluminum or copper, to establish electrical contact between non-adjacent levels of the protection device 10.

The illustrated junction diode 16 includes the moat region 36 which is typically doped with an n+ impurity to produce an n+/p junction diode. The junction diode 16 is electrically connected to the device gate oxide 22 by a metal lead line 34, thereby permitting the junction diode to preferentially leak electric current from the gate oxide region 22 and thereby protect the gate oxide 22 from currents that may pass through the device. However, in such manner, a protection diode would need to be designed into the integrated circuit for each transistor to insure protection.

This approach set forth is wasteful of die area because the introduction of these diodes that include diffusion areas occupy additional area of the integrated circuit. For example, in certain designs, the use of diodes can occupy 30%–40% of the area of the die. Moreover, the introduction of these additional diffusion areas, by virtue of the layout rules, takes up additional area in addition to the actual diffusion area to meet these minimum distance requirements of the layout rule. Therefore, this approach wastes die area, increases the cost of the integrated circuit, and sacrifices transistor density. Accordingly, a semiconductor device for protecting the gate electrode of transistors in a die that save more diffusion area as compared with the conventional one that use the protection diodes, and that reduces the cost and space consumption is desired.

SUMMARY OF THE INVENTION

It is therefore an object of the invention to provide a semiconductor device for preventing the process-induced charging damages by sharing cumulative charges with parasitic capacitors of the invention used as energy pools.

It is another object of this invention to provide a semiconductor device for protecting devices from the process-induced charging damages, and fighting against charges build up on the gate oxide of the protected devices by leading the majority of cumulative charges to the parasitic capacitors.

It is a further object of this invention to provide a semiconductor device for protecting devices from the process-induced charging damages, meanwhile, saving more chip area than the conventional one by virtue of the use of the parasitic capacitors.

It is also an object of this invention to compensate potential chemical mechanical polishing (CMP) dishing problems by using a dummy conductive layer constituting a dummy pattern as one electrode of the parasitic capacitor.

To achieve these objects, and in accordance with the purpose of the invention, the invention uses a semiconductor device comprising a semiconductor layer, at least one transistor comprising a source region, a drain region, a channel region, a gate oxide layer and a gate electrode, at least one parasitic capacitor comprising a conductive layers, a dummy conductive layer constituting a dummy pattern, and a dielectric layer interposed individually between the conductive layer and the dummy conductive layer, a first conductor connecting the gate electrode and the conductive layer, and a second conductor connecting the semiconductor layer and the dummy conductive layer. Furthermore, the dummy conductive layer can be a floating layer over the semiconductor layer. In such manner, the second conductor set forth is replaced by an interposed dielectric layer.

It is to be understood that both the foregoing general description and the following detailed description are exemplary and explanatory only and are not restrictive of the invention, as claimed.

BRIEF DESCRIPTION OF THE DRAWINGS

The objects, features and advantages of the semiconductor device for the present invention will be apparent from the following description in which.

DESCRIPTION OF THE PREFERRED EMBODIMENT

It is to be understood and appreciated that the process steps and structures described below do not form a complete process flow for the manufacture of integrated circuits. The present invention can be practiced in conjunction with various integrated circuit fabrication techniques that are used in the art, and only so much of the commonly practiced process steps are included herein as are necessary to provide an understanding of the present invention.

As will be described in greater detail below, the present invention relates to the provision of a parasitic capacitor in place of a conventional junction diode for protecting the gate oxide of the device from cumulative charging damages. Since, for any capacitance C, where $C = \in A/t,$ A=surface area of the electrode of the capacitance C,
∈=dielectric permittivity of the dielectric material, and
t=thickness of the dielectric material.

With large surface area, the parasitic capacitors of the present invention can share the majority of process-induced cumulative charges thereby inhibiting the associated gate oxide of the protected device from overcharging and breakdown during processing phase. In addition, the metal electrodes of the parasitic capacitors provide a dummy pattern, which can compensate the CMP dishing problem. Furthermore, because the dummy pattern is formed in the regions where the lead lines of the integrated circuit are absence, the use of the parasitic capacitors of the invention can utilize chip area with higher efficiency, meanwhile, diminish the CMP dishing problem. In addition, due to the larger capacitance of the parasitic capacitors, one parasitic capacitor can be connected to more than one protected device, thus designers or layout engineers can save more chip area.

Figure 1A:
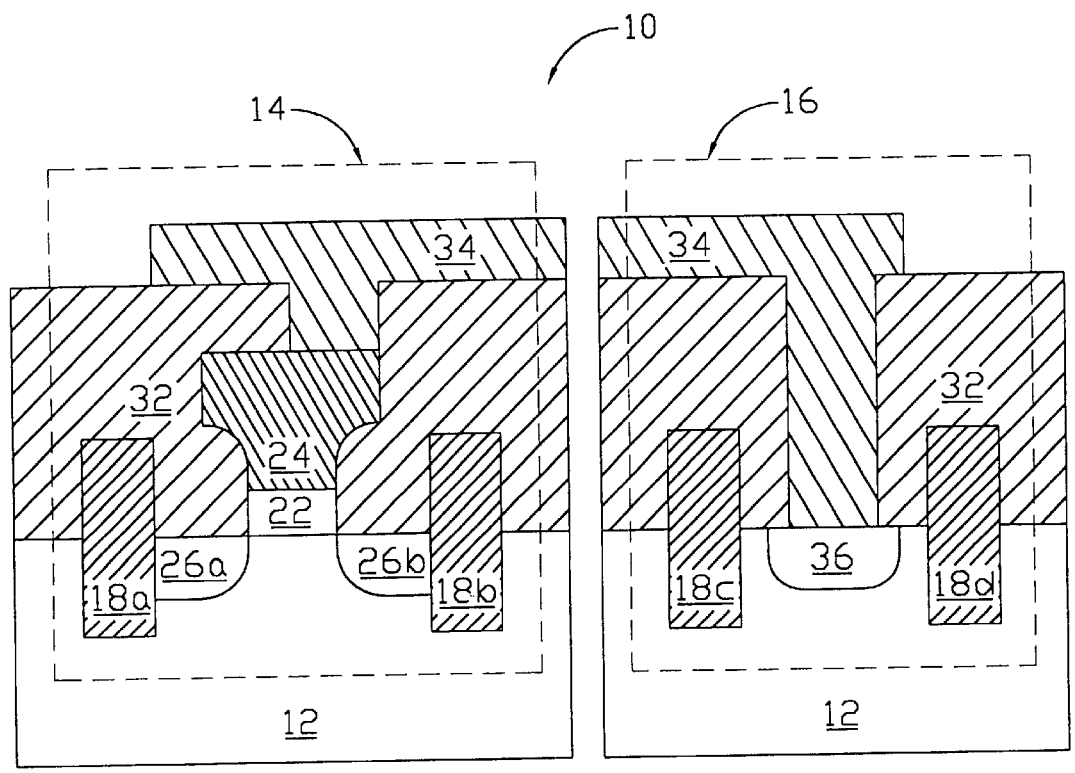
FIG. 1A shows a schematic cross sectional diagram of a conventional protection device used to solve the charge induced antenna effect.
Figure 1B:
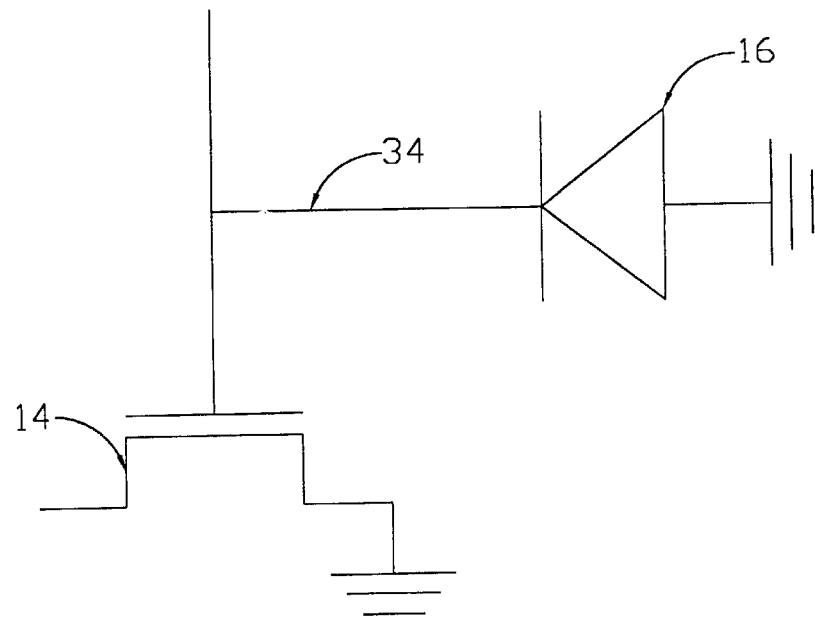
FIG. 1B shows the circuit of the conventional protection device shown in FIG. 1A.
Figure 2A:
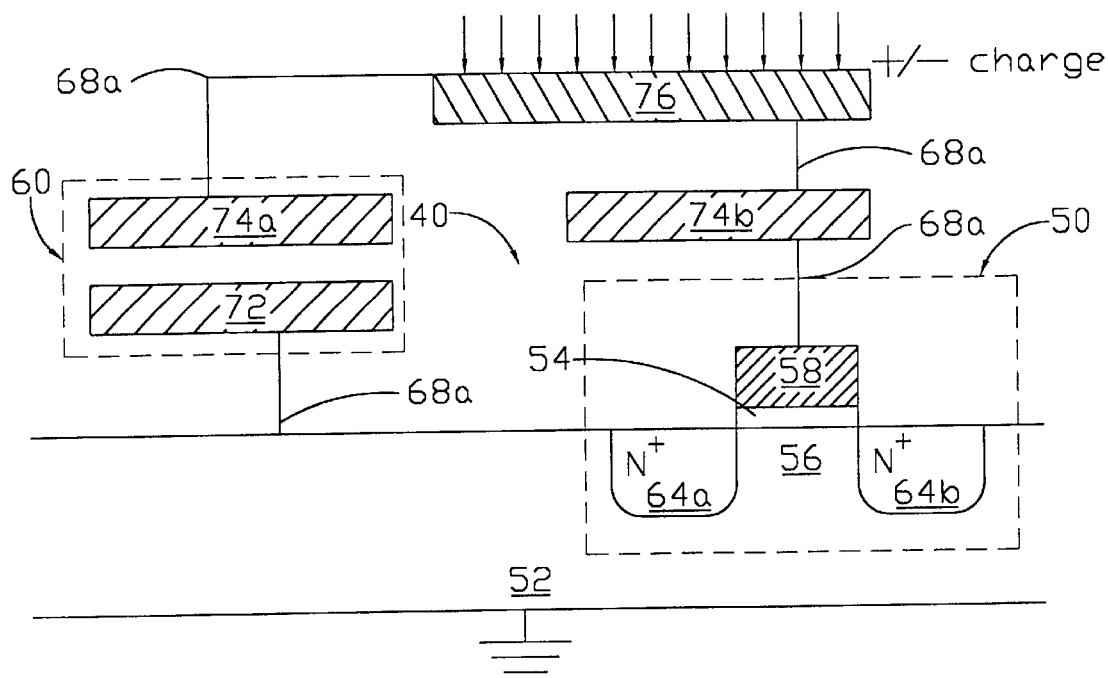
FIG. 2A shows a schematic cross sectional diagram of a first kind of the protection device of the invention.
Figure 2B:
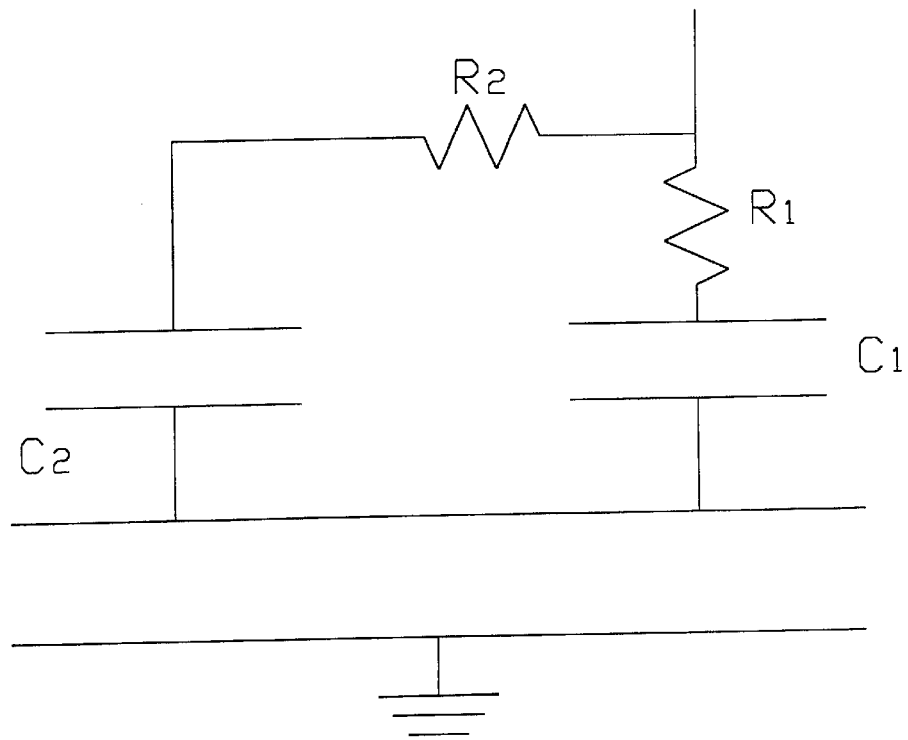
FIG. 2B shows the equivalence protection circuit of the first kind of the protection device.

FIG. 2A depicts a protection device 40 of the invention used to prevent the process-induced cumulative charge damages, and FIG. 2B shows the corresponding equivalence protection circuit. It is to be appreciated that the illustrated device can be constructed in accordance with a variety of known processing techniques, the specific manner of process not being relevant to the following discussion. The protection device 40 includes a substrate 52 that is typically formed from a semiconductive material such as silicon, which is doped with a p-type impurity, such as boron ions. The semiconductor substrate 52 can also be formed from a variety of other semiconductive materials, such as GaAs and HgCdTe, for which the principles of the present invention that are set forth below are likewise applicable. In the illustrated structure, a MOSFET under construction, which can be treated as a MOS capacitor, is designated generally by reference character 50, and the associated protective component, which is a parasitic capacitor, is designated generally by reference character 60. Source and drain regions 64a, 64b is formed in the semiconductor substrate 52 by using conventional methods, and a channel region 56 is formed between the source and drain regions 64a, 64b. A gate oxide region 54 that is typically thermally grown to a thickness of about 4–20 nm is formed between the source and drain regions 64a, 64b and on the semiconductor substrate 52. A gate electrode 58, which can be a polysilicon layer, is formed by patterning and applying in an appropriate manner over the gate oxide 54, and doping with an appropriate impurity, such as phosphorus ions, to render the polysilicon layer conductive. The gate electrode 58 is connected to conductive layers 74b and 76 by a lead line 68a. These conductive layers 74b and 76, that are sited on different levels separately, become "antennas" unavoidably during processing phases The parasitic capacitor 60, comprising a conductive layer 74a as an electrode and a dummy conductive layer 72 constituting the dummy pattern as the other electrode, is used to protect the MOSFET 50. The conductive layer 74a is connected to the gate electrode 58 by the lead line 68a and the dummy conductive layer 72 is connected to the semiconductor substrate 52 by the lead line 68a, so that the parasitic capacitor 60 can share cumulative charges with the MOSFET 50 whenever the antenna effect occurs. The conductive layer 74a and the dummy conductive layer 72 can be copper, aluminum and polysilicon, and they are unnecessary the same material. Furthermore, the electrode 74a of the parasitic capacitor 60 and the conductive layer 74b are formed together and both are part of the integrated circuit, whereas the dummy conductive layer 72 is not. The dummy conductive layer 72 constituting the dummy pattern can be formed in a similar manner that used to form lead lines of the integrated circuit in the art. Moreover, it is noted that the inter-metal dielectric (IMD) layers interposed between the dummy conductive layer 72 and the conductive layer 74a are not shown in the illustrated structure. In addition, the parasitic capacitor 60 can also be a stacked multilayer capacitor with polysilicon-to-metal or polysilicon-to-polysilicon or metal-to-metal electrodes. In such manner, the parasitic capacitor 60 can be treated as many single capacitors connected in series. Furthermore, more than one parasitic capacitor similar to the parasitic capacitor 60 can be connected in parallel in the integrated circuit.

Referring to FIG. 2B, the MOSFET 50 and the parasitic capacitor 60 can be regarded as capacitor $C_1$ and $C_2$ connected in parallel, wherein $R_1$ and $R_2$ are the equivalent resistance of the lead line 68a. The equivalent capacitance C, $$C=C_1+C_2,$$

wherein $$C_1=\varepsilon A_1/t_1, C_2=\varepsilon A_2/t_2,$$

$A_1$=area of the gate electrode 58, $A_2$=area of the electrode of the parasitic capacitor 60, $t_1$=thickness of the gate oxide 54, and $t_2$=average distance between the electrodes of the parasitic capacitor 60.

If $A_2=2A_1$, $t_1=t_2$, then $C_2=2C_1$. For cumulative charges Q and applied voltage V, since Q=CV, the charges accumulated on $C_1$ are 0.33Q, and the charges accumulated on $C_2$ are 0.667Q.

In view of the foregoing relationships, the parasitic capacitor 60 can be constructed to protect the MOSFET 50 from undesired cumulative charge damages incident to charging for a prescribed period of time. Furthermore, due to the use of the dummy pattern as electrodes and larger capacitance of the parasitic capacitor 60, one parasitic capacitor 60 can be connected to more than one MOSFET 50 in parallel, thus designers or layout engineers can save more chip area.

Figure 3A:
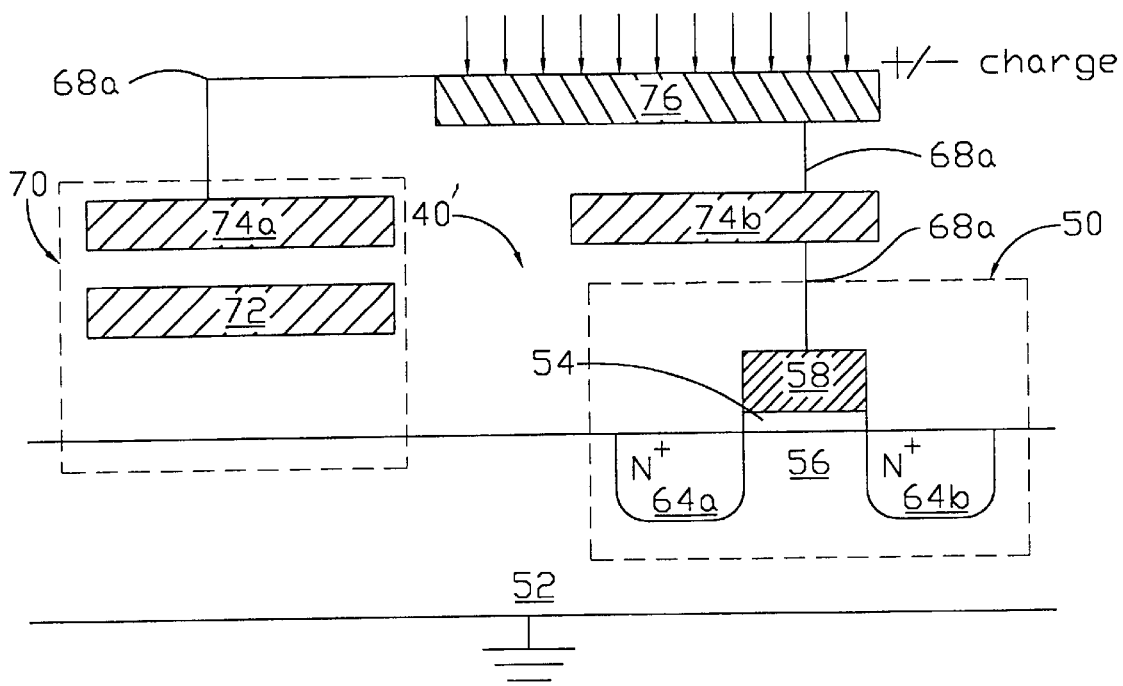
FIG. 3A shows a schematic cross sectional diagram of a second kind of the protection device of the invention.
Figure 3B:
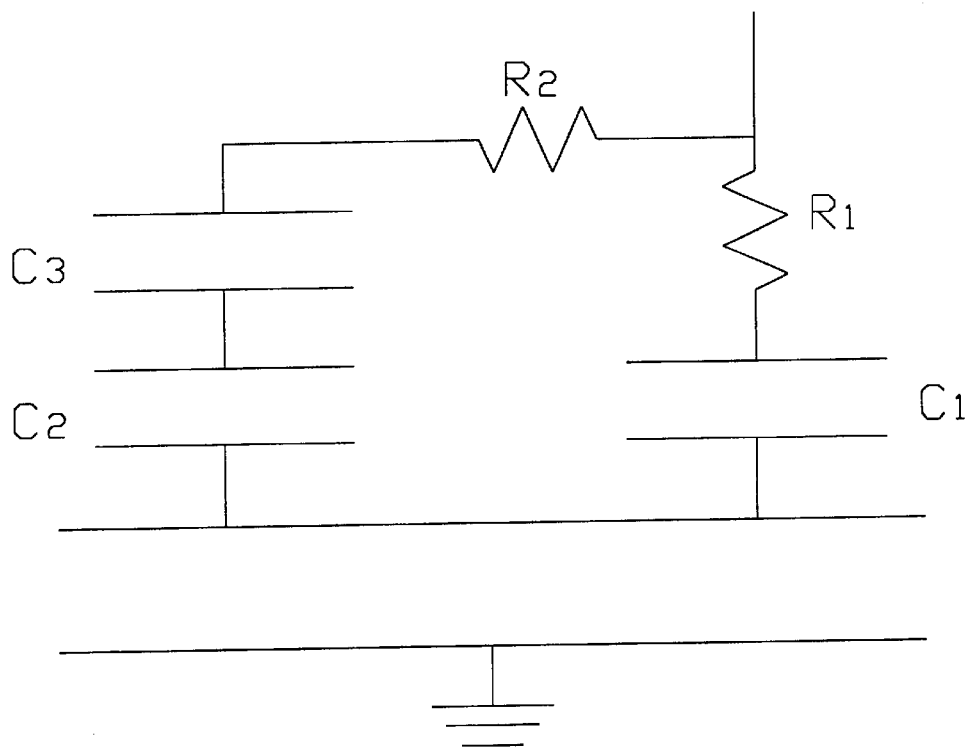
FIG. 3B shows the equivalence protection circuit of the second kind of the protection device.

FIG. 3A depicts a protection device 40' of the invention used to prevent the cumulative charge damages, and FIG. 3B shows the corresponding equivalence protection circuit. In this embodiment, a parasitic capacitor used to protect the MOSFET 50 is designated generally by reference character 70. The parasitic capacitor 70 comprises the conductive layer 74a, the dummy conductive layer 72, and a portion of semiconductor substrate 52 beneath the dummy conductive layer 72. Unlike the parasitic capacitor 60, the dummy conductive layer 72 of the parasitic capacitor 70 is "floating", that is, the dummy conductive layer 72 and the portion of semiconductor substrate 52 beneath the dummy conductive layer 72 constitute an additional capacitor. The dielectric layers, also known as the inter-metal dielectrics (IMD), which are interposed between the conductive layer 74a and the dummy conductive layer 72, and between the dummy conductive layer 72 and the portion of the semiconductor substrate 52, are not shown in the structure. Moreover, similar to the parasitic capacitor 60, the parasitic capacitor 70 also can be a stacked multilayer capacitor with polysilicon-to-metal or polysilicon-to-polysilicon or metal-to-metal electrodes. In such manner, the parasitic capacitor 70 can be treated as many single capacitors connected in series. In addition, similar to the parasitic capacitor 60, more than one parasitic capacitor 70 can be connected in parallel in the integrated circuit.

Referring to FIG. 3B, the parasitic capacitor 70 can be regarded as capacitors $C_2$ and $C_3$ connected in series. When it connects with the MOSFET 50 in parallel, the equivalent capacitance C, $$C=C_1+(C_2C_3/C_2+C_3),$$

wherein $$C_2=\varepsilon A_2/t_2, C_3=\varepsilon A_3/t_3,$$

$A_2$=area of the conductive layer 74a, $A_3$=area of the dummy conductive layer 72, $t_2$=average distance between the electrode 74a and the dummy conductive layer 72, and $t_3$=average distance between the dummy conductive layer 72 and the semiconductor substrate 52.

If $t_1=t_2=t_3$, $A_2=2.5A_1$, and $A_2=A_3$, then $C_2=2.5C_1$ and $C_2=C_3$. For cumulative charges Q and applied voltage V, since Q=CV, the charges accumulated on $C_1$ are 0.44Q, and the charges accumulated on $C_2$ and $C_3$ are 0.56Q.

In view of the foregoing relationships, the parasitic capacitor 70 can be constructed to protect the MOSFET 50 from undesired cumulative charge damages incident to charging for a prescribed period of time since it shares more charges. Furthermore, due to larger capacitance of the parasitic capacitor 70, one parasitic capacitor 70 can be connected to more than one MOSFET 50 in parallel, thus designers or layout engineers can save more chip area.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. A semiconductor device for preventing process-induced charging damages, said semiconductor device comprising:

a semiconductor layer;

at least one transistor, said transistor comprising a source region in said semiconductor layer, a drain region in said semiconductor layer, a channel region in said semiconductor layer extending between said source region and said drain region, a gate oxide layer formed over said channel region, and a gate electrode formed over said gate oxide layer;

at least one capacitor over said semiconductor layer, said capacitor comprising a conductive layer, a dummy conductive layer forming a dummy pattern, and a dielectric layer interposed between said conductive layer and said dummy conductive layer;

a first conductor connecting said gate electrode and said conductive layer; and a second conductor connecting said dummy conductive layer and said semiconductor layer.

2. The semiconductor device of claim 1, in which said transistor is an n-type metal oxide semiconductor field effect transistor.

3. The semiconductor device of claim 1, in which said transistor is a p-type metal oxide semiconductor field effect transistor.

4. The semiconductor device of claim 1, in which said conductive layer is a copper layer.

5. The semiconductor device of claim 1, in which said conductive layer is an aluminum layer.

6. The semiconductor device of claim 1, in which said conductive layers is a polysilicon layer.

7. The semiconductor device of claim 1, in which said dummy conductive layer is a copper layer.

8. The semiconductor device of claim 1, in which said dummy conductive layer is an aluminum layer.

9. The semiconductor device of claim 1, in which said dummy conductive layer is a polysilicon layer.

10. A semiconductor device for preventing process-induced charging damages, said semiconductor device comprising:

a semiconductor layer;

at least one transistor, said transistor comprising a source region in said semiconductor layer, a drain region in said semiconductor layer, a channel region in said semiconductor layer extending between said source region and said drain region, a gate oxide layer formed over said channel region, and a gate electrode formed over said gate oxide layer;

at least one capacitor over said semiconductor layer, said capacitor comprising a copper layer, a dummy conductive layer forming a dummy pattern, and a dielectric layers interposed between said copper layer and said dummy conductive layer;

a first conductor connecting said gate electrode and said copper layer; and a second conductor connecting said dummy conductive layer and said semiconductor layer.

11. The semiconductor device of claim 10, in which said transistor is an n-type metal oxide semiconductor field effect transistor.

12. The semiconductor device of claim 10, in which said transistor is a p-type metal oxide semiconductor field effect transistor.

13. The semiconductor device of claim 10, in which said dummy conductive layer is a copper layer.

14. The semiconductor device of claim 10, in which said dummy conductive layer is an aluminum layer.

15. The semiconductor device of claim 10, in which said dummy conductive layer is a polysilicon layer.

16. A semiconductor device for preventing process-induced charging damages, said semiconductor device comprising:

a semiconductor layer;

at least one transistor, said transistor comprising a source region in said semiconductor layer, a drain region in said semiconductor layer, a channel region in said semiconductor layer extending between said source region and said drain region, a gate oxide layer formed over said channel region, and a gate electrode formed over said gate oxide layer;

at least one capacitor over said semiconductor layer, said capacitor comprising a portion of said semiconductor layer, a dummy conductive layer forming a dummy pattern and above said portion of said semiconductor layer, a conductive layer above said dummy conductive layer, and two dielectric layers interposed individually between said conductive layer and said dummy conductive layer, and between said portion of said semiconductor layer and said dummy conductive layer; and a conductor connecting said gate electrode and said conductive layer.

17. The semiconductor device of claim 16, in which said transistor is an n-type metal oxide semiconductor field effect transistor.

18. The semiconductor device of claim 16, in which said transistor is a p-type metal oxide semiconductor field effect transistor.

19. The semiconductor device of claim 16, in which said conductive layer is a copper layer.

20. The semiconductor device of claim 16, in which said conductive layer is an aluminum layer.

21. The semiconductor device of claim 16, in which said conductive layer is a polysilicon layer.

22. The semiconductor device of claim 16, in which said dummy conductive layer is a copper layer.

23. The semiconductor device of claim 16, in which said dummy conductive layer is an aluminum layer.

24. The semiconductor device of claim 16, in which said dummy conductive layer is a polysilicon layer.

* * * * *